United States Patent [19]

Burrows

[11] Patent Number: 4,600,846
[45] Date of Patent: Jul. 15, 1986

[54] UNIVERSAL LOGIC CIRCUIT MODULES

[75] Inventor: James L. Burrows, Merrimack, N.H.

[73] Assignee: Sanders Associates, Inc., Nashua, N.H.

[21] Appl. No.: 539,504

[22] Filed: Oct. 6, 1983

[51] Int. Cl.$^4$ ............... H03K 19/177; H03K 19/20; G06F 7/50

[52] U.S. Cl. .................. 307/465; 307/202.1; 307/445; 364/784

[58] Field of Search .............. 307/202.1, 440, 445, 307/465–469; 340/825.8, 825.83, 825.84, 825.87; 364/716, 784

[56] References Cited

U.S. PATENT DOCUMENTS

| | | | |
|---|---|---|---|
| 3,239,687 | 3/1966 | Steele | 307/445 |
| 3,593,317 | 7/1971 | Fleisher et al. | 364/716 X |
| 3,731,073 | 5/1973 | Moylan | 307/465 X |
| 3,737,859 | 6/1973 | Kadow | 340/825.87 |
| 3,805,037 | 4/1974 | Ellison | 340/825.87 X |
| 4,257,008 | 3/1981 | Shepter | 307/465 X |
| 4,422,072 | 12/1983 | Cavlan | 307/465 X |

OTHER PUBLICATIONS

Hicks, "Sequence Controllers Using Programmable Logic Arrays", *IBM TDB*, vol. 19, No. 8, pp. 3183–3184, 1/1977.
Muroga et al, *IEEE Trans. on Computers;* vol. C-25, No. 9; 9/1976; pp. 839–907.
*IEEE Trans. on Computers;* vol. C-21, No. 2, pp. 153–160, 2/1972, Baugh et al.
Gardner, "Logic Array"; *IBM TDB;* vol. 18, No. 2, pp. 557–559; 7/1975.

*Primary Examiner*—Larry N. Anagnos
*Attorney, Agent, or Firm*—Louis Etlinger; Wm. F. Porter, Jr.

[57] ABSTRACT

Universal logic circuit cells for use in designing and laying out electronic circuits. The cells provide AND and OR on other logical functions on input signals, and include a conventional AND or OR gate, or other logic gate, and associated input and output connections and circuitry that enables them to be used in many applications. The cells simplify laying out a combinatorial logic circuit after it has been designed.

13 Claims, 6 Drawing Figures

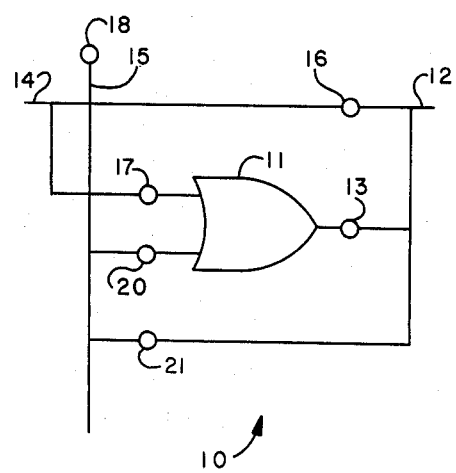
FIG. 1
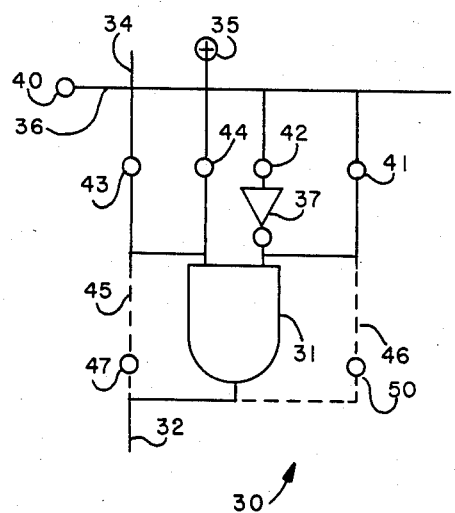
FIG. 2
FIG. 6
FIG. 3

UNIVERSAL LOGIC CIRCUIT MODULES

BACKGROUND OF THE INVENTION

1. Field of the Invention

This invention relates generally to the field of electronic circuits and more specifically to universal logic circuit cells and modules that can be used to lay out many complex combinatorial logic circuits with a minimum of interconnecting wiring, unused connections and unused space. The invention will find greatest use on integrated circuits, but it can also find utility in circuits implemented in more discrete form on a printed circuit board.

2. Description of the Prior Art

In recent years, it has become common to use read-only memories and programmable logic arrays to implement combinatorial logic functions as substitutes for combinatorial logic circuits that would otherwise be quite irregular and which could consume considerable amounts of space on an integrated circuit chip. For example, combinatorial logic used in the feedback paths of finite state machines is often highly complex and irregular. See, for example, Mead and Conway, Introduction to VSLI Systems, Addison Wesley (1980), at pages 79-82. Read only memories have been used as a substitute for combinatorial logic to generate predetermined output signals based on selected patterns of input signals. The input signals constitute address signals that identify one storage location, the contents of which contain a number of bits each of which corresponds to one of the required output signals.

A further benefit arises from the use of read only memories and programmable logic arrays, namely, that these elements can be readily changed during the checkout phase of product development, whereas combinatorial logic circuits implementing similar functions cannot be so readily changed without substantial revisions in circuit layout.

It is common, however, for a circuit to not require all of the addressable locations that would be identified by the input signals. In an actual circuit, the actual number of different combinations of input signals that may be encountered may be far fewer than would otherwise be represented by the number of input signals present. Further, in some instances, some of the input signals may not contribute to the selection of a location. Accordingly, providing one storage location for each possible combination of input signals may also consume considerable amounts of unnecessary space on an integrated circuit chip. Programmable logic arrays alleviate some of the problems inherent in read only memories by allowing many of the unnecessary circuits to be eliminated.

However, programmable logic arrays, particularly those used to implement arithmetic functions such as adders, adder/subtractors, fraction point shifters, and the like, often also take up substantial amounts of unnecessary space on a chip. Typically, programmable logic arrays comprise two spacially segregated arrays, an input array that comprises AND gates and an output array comprising OR gates that receive signals from the AND array and generates the output signals therefrom. Typically, the input signals to the AND array are complemented or inverted, and both the non-inverted and the inverted signals run throughout the array, which increases the amount of space on the chip taken up by the array.

Another problem that arises with programmable logic arrays, in part because of the segregation of the AND and OR functions into separate arrays, is that it may be difficult to check the connections to verify that the desired output signals are generated for every possible combination of input signals. For example, while it may be known that a logic operation should include an Exclusive-OR function, that function may not be readily apparent from examining a programmable logic array circuit.

SUMMARY

Accordingly, the invention provides a new set of universal logic circuit modules or cells each of which provides a primitive logic function such as AND and OR, that can be interconnected and used by a logic designer to lay out logic circuits. The cells may be used in various combinations to form circuits on integrated circuit chips. The use of the cells in circuit design simplifies the task of design and verification, and may produce more regular circuits, particularly in circuits that implement arithmetic operations.

In brief summary, the new circuit cells include one cell that provides an OR function and another that provides an AND function. Each of the logic modules contains a conventional logic function circuit, such as an AND gate and an OR gate, each of which has two input terminals and an output terminal. Input lines to the cells run generally orthogonal to each other, and are disposed a selected distance from an edge of the cell. The output lines from the modules also run a selected distance from an edge of the cells, to ensure that they will connect to an input line of a downstream cell. Each of the AND and OR cells includes selected combinations of lines between the input lines and the input terminals of the respective gates. Connections may be made over the lines to form various combinations of the signals at the input lines at the input terminals by selectively completing connections at contacts in these lines, or by blowing fusible links in the lines. Accordingly, circuit functions may be established by establishing connections across the contacts.

For example, in the AND cell selective connections may be established between the two input lines and the input terminals of the resident AND gate. A connection may be made to complement one of the input signals through an inverter, thereby creating a locally-generated complemented signal where it is needed. Further, an input terminal may be connected to a source of positive voltage to effectively couple the signal or its complement on one of the input lines through the cell.

In the OR cell, selective connections may be established between the input lines and the input terminals, or to by-pass the cell where no function is required by the gate and it is desired to eliminate delays that would be encountered going through the gate. Further, connections may be established between the two input lines to couple the signal on one line to the other line.

In addition to or as substitutes for, the AND and OR cells, cells providing other primitive logic function, such as NAND and NOR, may be provided. A NAND cell which includes a NAND gate, and a NOR cell, which includes a NOR gate, may be used, for example, where it is desired to use cells incorporating only one type of gate, as many circuits can be designed solely from NAND or NOR gates. Connections between the two orthogonal input lines may be established to provide all of the functions of the AND and OR cells.

The cells provided by the invention may be used in a number of ways. For example, if a general purpose integrated circuit chip uses both AND and OR cells, the cells may be provided in a regular pattern such as a stripe, checkerboard, or cluster pattern. For example, in a stripe pattern the cells of each stripe would be of a particular type, and the rows of different types would be interleaved. The cells may be interconnected selectively to form the desired circuits. The selective interconnections may cause certain cells to be bypassed if they are not needed in the circuit. The bypassed cells may also be used in other circuits, thus enabling closer or more dense packing of the circuits on a chip.

The benefits of using the cells in circuit design is not limited to general purpose chips, but can also be obtained in the design of custom circuits on integrated circuit chips. Since the cells incorporate most of the interconnection techniques required in circuit design, a circuit designer can advantageously use the cells wherever he needs gates of the appropriate kind and close the appropriate connections. Since the cells are regular, they will be close-packed on the chip, thereby saving space, and since all cells of the same type are identical, the designer need not custom-design each gate, thereby saving considerable time in circuit design.

BRIEF DESCRIPTION OF THE DRAWINGS

This invention is pointed out with particularity in the appended claims. The above and further objects and advantages of this invention may be better understood by referring to the following description taken in conjunction with the accompanying drawings, in which:

FIG. 1 depicts a logic circuit layout of a cell according to the invention that produces a logical OR function;

FIG. 2 depicts a logic circuit layout of a cell according to the invention that produces a logical AND function;

FIG. 3 depicts an example of a logic layout for a complex combinatorial logic circuit, namely a three input adder;

FIG. 6 depicts a circuit layout of a cell according to the invention that produces a logical NAND function.

DESCRIPTION OF AN ILLUSTRATIVE EMBODIMENT

Figure 4:
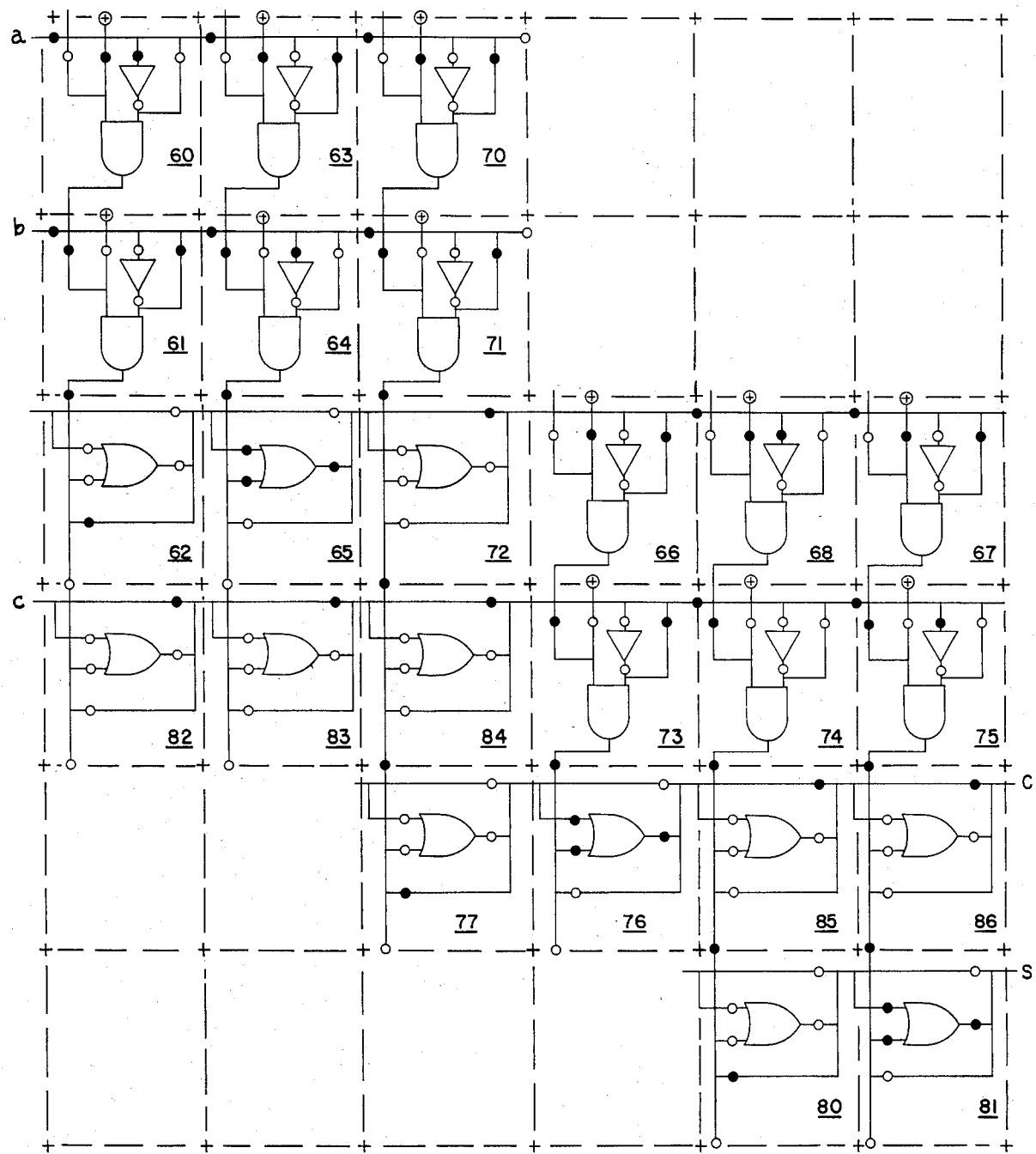
FIG. 4 depicts a circuit layout for the adder of FIG. 3 using the logic cells of FIGS. 1 and 2.
Figure 5:
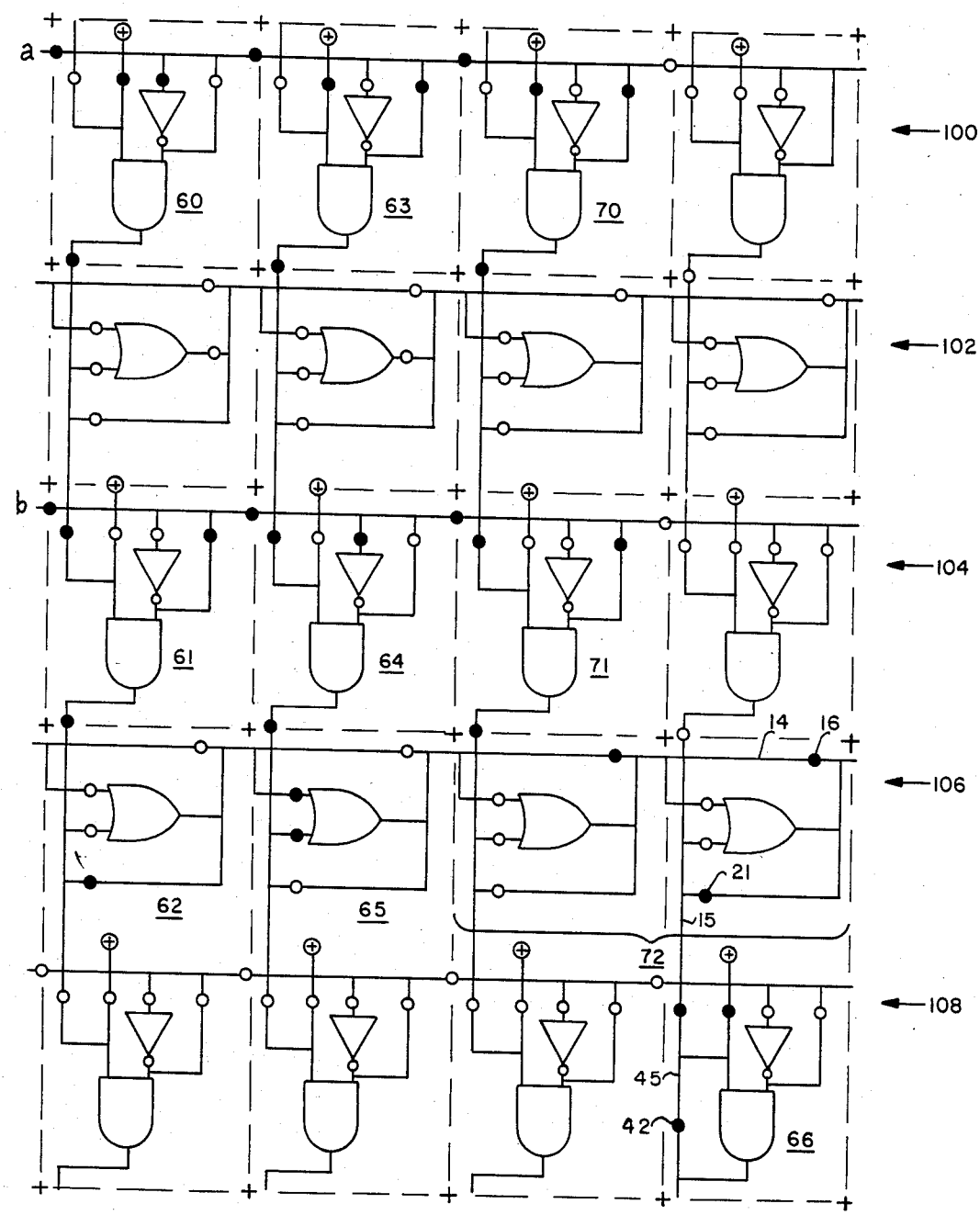
FIG. 5 depicts a circuit layout of a portion of the adder in FIG. 4 in which the AND and OR cells are "striped" in alternating and interleaving rows.

With reference to FIGS. 1 and 2, the invention provides new cells of electronic circuitry that provide AND and OR logic functions which may be used by a circuit designer to lay out complex logic circuits, as shown in FIGS. 4 and 5. With reference to FIG. 1, OR cell 10 includes a conventional OR gate 11 having two input terminals and a single output terminal. The output terminal is connected to an output line 12 through a contact 13. A connection may be established across the contact 13 to couple the output signal from the output terminal of OR gate 11 to downstream circuitry (as illustrated in FIGS. 4 and 5).

Two input signals may be coupled to cell 10 on two input lines 14 and 15. Input line 14 is disposed generally parallel to output line 12 and may be connected thereto through a contact 16 if it is desired to bypass the OR gate 11. The signal on line 14 may also be coupled to an input terminal of OR gate 11 through a contact 17. The second input line 15, which is disposed generally orthogonal to input line 14, may receive an input signal from upstream circuitry, as shown below with respect to FIGS. 4 and 5, through a contact 18, and may couple the signal to the second input terminal of OR gate 11 through a contact 20. Alternatively, the signal on input line 15 may be coupled directly to output line 12 through a contact 21. While it is apparent that contacts 16 and 21 are not necessary, as the corresponding signals may be coupled through OR gate 11 by appropriate closing of contacts 17 or 20 and 13, the contacts 16 and 21 may be provided to avoid signal delays that would be inherent in passing through OR gate 11.

FIG. 2 depicts a circuit layout for an AND cell 30 including an AND gate 31 which also has two input terminals and an output terminal. The output terminal is connected to an output line 32. One of the input terminals of AND gate 31 may be selectively connected to an input line 34 or a source 35 of positive voltage. The other input terminal of AND gate 31 may be selectively connected to a second input line 36 to receive either a direct, non-inverted signal from upstream circuitry or an inverted, complemented signal through an inverter 37. The signal on input line 36 is coupled to cell 30 through a contact 40, and the non-inverted signal is coupled to AND gate 31 through a contact 41. The input signal is coupled to inverter 37 through a contact 42. The signal from line 34 or voltage source 35 may be coupled to cell 31 by selective closing of contacts 43 or 44, respectively. In addition, bypass lines 45 and 46, with contacts 47 and 50, may be provided if necessary to bypass the AND gate 31 and couple a signal on either input line directly onto output line 32. These connections are depicted in FIG. 2 as dashed lines. Thus if lines 45 and 46 are provided, closing of contacts 47 and 43 would couple the signal on input line 34 directly to output line 32. Similarly, closing of contacts 41 and 50 would cause an input signal on line 36, received through contact 40, to be coupled directly to output line 32. It should be noted that the inverted, complemented signal on input line 36 can also be coupled directly to output line 32 if the contacts 42 and 50 are closed and the contact 41 is left open. Further, if line 46 and contact 50 are provided, voltage source 35 and contact 44 need not be included in the cell. However, it may be desirable to include source 35 and contact 44 in some designs of cell 30, even if line 46 and contact 50 have been provided, as it may be desirable to use cell 30 in some instances as to buffer signals betwen upstream and downstream circuitry.

The AND gate 31 and OR gate 11 used in cells 30 and 10, respectively, may be any conventional logical gate circuits that provide the AND and OR functions. The circuitry forming the gates may be MOS or bipolar; the particular nature of the circuitry forming the gates is not critical to the invention. Similarly, the inverter 41 included in cell 30 may be any conventional inverter circuit. In one specific embodiment, the contacts are formed by leaving gaps in the lines connecting the various portions of the cell, and the connections may be established by completing the lines. For example, if the cells are formed on a printed circuit board, a contact may be formed by leaving a gap in a trace, and the connection completed by depositing an appropriate metallization across the gap. Alternatively, connections may be broken by selectively cutting traces on the board. In an integrated circuit, a connection may be completed by completing lines between the circuit elements forming the cell, or by laying a line of metal between two contact points on the upper surface of the circuit. Fusible links may also be provided.

As is apparent by inspection of FIGS. 1 and 2, the individual cells 10 and 30 can both accommodate only two input signals, one on the parallel input lines 14 and 34 and the other on the orthogonal input lines 15 and 36. If more input signals must be accommodated to achieve the desired logic function, multiple cells may be used to receive the signals in pairs, and the cells may be cascaded to form the ultimate logic function.

As has been mentioned, one of the benefits of using the cells of FIGS. 1 and 2 is that it simplifies actual circuit checking and layout after the logic functions have been established. This is illustrated with respect to FIGS. 3 and 4. FIG. 3 depicts a logic layout for a three input adder, where the input signals are a, b, and c, and the outputs are S, which is a signal that represents the "sum" of the input signals, and C, which represents the "carry" of the input signals. The "S" output signal is asserted if any odd number of input signals is asserted, and otherwise is negated; the "C" output signal is asserted if any two or three of the input signals are asserted and otherwise is negated. In the logic arrangement shown in FIG. 3, in typical format a circle at an intersection of lines represents an "AND NOT-" (that is, an AND function in which the last-mentioned signal is inverted or complemented) function, a dot represents an AND function, and an asterisk represents an OR function. Thus, circle 60 and dot 61 combine to couple a signal representing the logical function "b AND NOT-a" to asterisk 62. Similarly, dot 63 and circle 64 combine to couple a signal representing the logical function "a AND NOT-b" to asterisk 65. Finally, asterisk 62 and asterisk 65 combine to couple a signal representing the logical function "'a AND NOT-b' OR 'b AND NOT-a'" to dots 66 and 67 and to circle 68. By following through the connections for the logical functions depicted in FIG. 3, the expression for the sum signal S as a logical function of input signals a, b and c is as follows:

S="[(a AND NOT-b) OR (b AND NOT-a)] AND NOT-c" OR "c AND NOT-[(a AND NOT-b) OR (b AND NOT-a)]"

The expression for the carry output signal C as a function of the a, b, and c input signals as as follows:

C+"(a AND b)" OR "c AND [(a AND NOT-b) OR (b AND NOT-a)]"

FIG. 4 depicts a circuit layout for the adder depicted in FIG. 3 using the cells of FIGS. 1 and 2. Thus, the circuit element of FIG. 3 identified by the reference numeral 60 is illustrated as an AND cell in FIG. 4 and is identified by reference numeral 60, and so forth. One terminal of the resident AND gate of element 60 is connected to the positive voltage source, to maintain the gate in an enabled condition, and the "a" signal input is coupled through the resident inverter of cell 60. Cell 60 thus provides an "AND NOT-" function to complement the "a" input signal, as required by the logic depicted in FIG. 3. The complemented "a" signal is coupled to cell 61, where an AND operation is performed on it and the "b" input signal. By comparing the layout of the cells in FIG. 4 to the logic layout in FIG. 3, it is apparent that the layout of the cells in FIG. 4 is identical to the layout of the logic as set forth in FIG. 3.

The use of cells 10 and 30 (FIGS. 1 and 2) in laying out a circuit is illustrated by reference to FIGS. 3 and 4. The layout of FIG. 4 can be transferred directly to an actual circuit implementation, specifically to a layout for a printed circuit board or to mask designs for an integrated circuit, with some additional connections for power sources that would be required in any circuit. Accordingly, using cells 10 and 30, a circuit can be laid out in a very short time after the logic, as illustrated in FIG. 3, has been developed. Further, since the cells that are used are compact and preferably of equal dimensions, compact circuits can be designed, reducing the amount of space that a circuit might otherwise occupy on a chip or circuit board.

The ease with which the logic of a circuit incorporating the cells of FIGS. 1 and 2 can be verified can also be seen with reference to FIG. 4. The AND cells 60, 61, 63, and 64 and OR cells 62 and 65 combine to provide an Exclusive-OR logic function, as can be seen by inspection of the circuit schematic. Similarly, AND cells 67, 68, 74, and 75, and OR cells 80 and 81 also provide the Exclusive-OR logic function. Other features of the circuit can also be verified by inspection of the circuit schematic.

FIG. 4 illustrates the use of cells 10 and 30 to form a custom circuit design; that is, the cells are constructed in a chip (or on a circuit board) in the pattern depicted in FIG. 4. As has been mentioned, chips can also be fabricated in which the different types of cells, that is AND cells 30 and OR cells 10, are deposited regular arrangements such as rows, or "stripes", a checkerboard pattern, or the like. In a striped pattern, all of the cells in each row have the same type of cell, and the adjacent rows have alternating types of cells. FIG. 5 depicts such a configuration, in which rows 100, 104 and 106 all contain AND cells 30, and rows 102 and 106 containing OR cells 10. FIG. 5 illustrates connections that may be made to use the circut as a portion of the adder depicted in FIG. 4, thus row 100 contains AND cells 60, 63 and 70; row 104 contains AND cells 61, 64 and 71; row 106 contains OR cells 62, 65 and 72, and row 108 contains AND cell 66. None of the OR gates in row 102 are used, and connections are established across their contacts 18 (FIG. 1) to the AND cells of row 104. Further, the rightmost AND cell of row 100 is not used in the circuit, and so no connection is formed at its contact 40 (FIG. 2). Accordingly, the cell could be used, along with the rightmost OR cell in Row 102 for other logical operations.

The OR cells of Row 106 perform the logical functions of cells 62, 65 and 72 of FIG. 4, with the right two cells, both marked with the reference numeral 72, together performing the function of cell 72 in FIG. 4. Cell 72 directs the output of cells 62 and 65 to AND cell 66, which, in FIG. 5, is in row 108. Connections as established in the rightmost cell of Row 106 in contacts 21 and 16 couple the input signal from parallel input line 14 onto orthogonal input line 15. In this case, orthogonal input line 15 actually operates as an output line, coupling the signal to the input of the rightmost AND cell in row 108. Here, it would be necessary to have a bypass line 45 and contact 47 (FIG. 2) for the cell, to achieve the same operation as cell 66 in FIG. 4.

The arrangement of the array in FIG. 5 uses more space than would a custom chip as shown in FIG. 4, but it may be less expensive to fabricate, as a myriad of circuits can be designed using the one standard chip on which the cells 10 and 30 are formed. Contacts may be established or broken by programming much as they are in PROMs or EPROMs, or by blowing fusible links, as in programmable logic arrays, or by inscribing them directly onto masks during chip fabrication.

Cells incorporating only AND or OR gates have been shown, but it is apparent that cells which perform other logical functions, such as NAND and NOR can also be provided within the scope of the invention. FIG. 6 illustrates a NAND cell 125 including a NAND gate 126 of conventional construction, parallel and orthogonal input lines 127 and 130 and an output line 131. A contact 132, when a connection is established thereacross, couples the output of NAND gate 126 onto the output line 131. Contacts 133 and 134 bypass gate 126, coupling the signals from lines 127 and 130 directly onto output line 131 if the cell is to be bypassed to avoid a gate delay that would be inherent in directing a signal through the gate 126. Contacts 135, 136 and 137, when closed, couple signals from input lines 130, 127 (directly) and 127 (inverted through an inverter 140). A NOR cell would be constructed identically, except that the NAND gate 126 would be replaced by a NOR gate of conventional construction.

NAND cell 125 may be advantageously used where it is desired to fabricate circuitry using only one type of gate. An adder such as is depicted in FIGS. 3 and 4, for example, can be constructed using only NAND cells.

Although only one example of the use of the cells 10 and 30 in a circuit has been shown, it will be appreciated that the cells can advantageously be used in many other applications. Since more complex elements such as flip-flops of many types, counters, delay lines, and so forth, are built up of circuits having AND and OR cells and inverters, it is readily apparent that these cells may be used to design, lay out and fabricate such elements with the same advantages as with other types of circuits.

The foregoing description is limited to specific embodiments of this invention. It will be apparent, however, that this invention can be practiced in cells having diverse basic constructions or that use different internal circuitry than is described in the specification with the attainment of some or all of the foregoing objects and advantages of this invention. Therefore, it is the object of the appended claims to cover all such variations and modifications as come within the true spirit and scope of this invention.

What is claimed as new and desired to be secured by Letters Patent of the United States is:

1. An integrated logic circuit comprising a plurality of logic cells each performing a conventional basic logic function on input signals from lines arrayed in a substantially rectangular grid arrangement defining generally horizontal and vertical directions, each of said logic cells including a logic gate for performing the logic function having two input terminals and an output terminal, one of said input terminals and said output terminal being connectable either to one of the horizontally or vertically arrayed lines or to means for providing a constant enabling signal, said other input terminal being connected to connection means that connects said other input terminal to the other of the horizontally or vertically arrayed lines, for coupling the input signal thereon to said other input terminal of said logic gate, and a contact connected to said output terminal and the output line for selectively allowing a conductor means to be deposited thereon between either of said input terminals and the output line.

2. An integrated logic circuit as defined in claim 1 wherein said means for providing a constant enabling signal comprises a source of positive voltage.

3. An integrated logic circuit as defined in claim 1 performing an AND logic function wherein said connection means for the logic cell further comprises an inverter for inverting the input signal from said other of the horizontally or vertically arrayed lines prior to coupling it to said other input terminal.

4. An integrated logic circuit as defined in claim 1 wherein said connection means further includes means for coupling the input signal from either of said input lines thereon to a neighboring logic cell.

5. An integrated logic circuit as defined in claim 1 further comprises a first lead having a contact, connected to said one of said input lines, to said means for providing a constant enabling signal, and to said logic gate one input terminal, for selectively allowing a conductor means to be deposited thereon between the said one input terminal and the selected one input line or means for providing a constant enabling signal.

6. A logic cell for use in constructing an integrated logic circuit for performing a conventional basic logic function on input signals from lines arrayed on the integrated logic circuit in a substantially rectangular grid arrangement defining generally horizontal and vertical directions, said logic cells including a logic gate for performing the logic function having two input terminals and an output terminal, one of said input terminals and said output terminal being arrayed lines or to means for providing a constant enabling signal, said other input terminal being connectable to connection means that connects said other input terminal to the other of the horizontally or vertically arrayed lines, for coupling the input signal thereon to said other input terminal of said logic gate, said one input terminal being connectable to one of the input lines through a contact or to a source of enabling voltage through another contact; and a line connected to one of the input terminals and the output terminal, the line including a contact for bypassing the gate.

7. A logic cell as defined in claim 6 in which said other input terminals is selectively through a contact or by another contact through an inverter to the other of the input lines.

8. A logic cell as defined in claim 6 wherein one of the input lines includes a contact which may be closed to direct the signal theron to the cell.

9. A logic cell as defined in claim 6 wherein the input lines are disposed orthogonally to each other and the output line is generally parallel to one of the input lines, the input line and the output line being disposed a selected distance from an edge of a cell so that the output line of one cell is connectable to an input line of a downstream cell, and an input line of one cell is connectable to an input line of a neighboring cell.

10. A logic cell as defined in claim 6 for performing an AND logical function wherein the gate comprises an AND gate having two input terminals and an output terminal, one input terminal being connectable through contacts to one of the input lines or a source of enabling voltage, the other input terminal being connectable through contacts to the other input line or to an inverter whose input is connected to the other input line and a bypass line connected to one of the input terminals and the output terminal and including a contact, so that closure of the contact couples the signal at the input terminal to the output terminal of the AND gate.

11. A logic cell as defined in claim 6 for performing an OR logical function wherein the gate comprises an OR gate having two input terminals and an output terminal, each input terminal being connectable to one of the input lines through a contact and the output terminal being connectable to the output line through a contact, and each of the input lines being connectable to the output line through a contact and bypass line.

12. A logic cell as defined in claim 6 for performing a NAND logical function wherein the gate comprises a NAND gate having two input terminals and an output terminal, one input terminal being connectable to one input line through a contact, the other input terminal being connectable through contacts to the other input line or to an inverter whose input is connected to the other input line, and each of the input lines being connectable to the output line through a contact and bypass line.

13. A logic cell as defined in claim 6 for performing a NOR logical function wherein the gate comprises a NOR gate having two input terminals and an output terminal, one input terminal being connectable to one input line through a contact, the other input terminal being connectable through contacts to the other input line or to an inverter whose input is connected to the other input line, and each of the input lines being connectable to the output line through a contact and bypass line.

* * * * *